United States Patent
Bui et al.

(10) Patent No.: US 8,476,947 B2
(45) Date of Patent: Jul. 2, 2013

(54) DUTY CYCLE DISTORTION CORRECTION CIRCUITRY

(75) Inventors: John Henry Bui, Sunnyvale, CA (US);
Lay Hock Khoo, Georgetown (MY);
Khai Nguyen, San Jose, CA (US);
Chiakang Sung, Milpitas, CA (US); Ket Chiew Sia, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 67 days.

(21) Appl. No.: 13/295,875

(22) Filed: Nov. 14, 2011

(65) Prior Publication Data
US 2013/0120044 A1     May 16, 2013

(51) Int. Cl.
*H03K 3/017* (2006.01)
(52) U.S. Cl.
USPC .......................................... 327/175; 327/172
(58) Field of Classification Search
None
See application file for complete search history.

(56) References Cited

U.S. PATENT DOCUMENTS

| | | | |
|---|---|---|---|
| 5,157,277 A | 10/1992 | Tran et al. | |
| 6,060,922 A | 5/2000 | Chow et al. | |
| 6,366,115 B1 | 4/2002 | DiTommaso | |
| 6,566,925 B2 * | 5/2003 | Ma | 327/175 |
| 6,819,143 B1 | 11/2004 | Chung | |
| 7,202,722 B2 | 4/2007 | Mahadevan et al. | |
| 8,358,162 B2 * | 1/2013 | Kang | 327/175 |
| 2003/0102926 A1 | 6/2003 | Hsieh | |
| 2011/0227622 A1 | 9/2011 | Kang | |

OTHER PUBLICATIONS

Ravi et al., U.S. Appl. No. 12/814,344, filed Jun. 11, 2011.

* cited by examiner

*Primary Examiner* — An Luu
(74) *Attorney, Agent, or Firm* — Treyz Law Group; Jason Tsai

(57) ABSTRACT

Integrated circuits with clock generation and distribution circuitry are provided. Integrated circuits may include phase-locked loops configured to generate multiple clock signals that are delayed versions of one another. The clocks signal may be distributed to various regions on an integrated circuit using serially connected clock buffer blocks. Each buffer block may include bidirectional pairs of buffer circuits coupled in parallel. Each buffer circuit may have a first input configured to receive an input clock signal, an output at which a corrected version of the input clock signal is provided (e.g., an output at which an output clock signal with desired duty cycle is provided), a second input that receives a first delayed clock signal for setting the desired duty cycle for the output clock signal, and a third input that receives a second delayed clock signal that is high at least when the first delayed clock signal rises high.

21 Claims, 12 Drawing Sheets

|  |  | CHANNEL #1 | | | CHANNEL #2 | | |
| --- | --- | --- | --- | --- | --- | --- | --- |
|  |  | Iset | In | Irelease | Iset | In | Irelease |
| CLK (0°) → | Input | IO<2> | IO<0> | IO<1> | IO1<2> | IO1<0> | IO1<1> |
|  | Output |  | IO1<0> |  |  | IO2<0> |  |
| CLK1 (90°) → | Input | IO<3> | IO<1> | IO<2> | IO1<3> | IO1<1> | IO1<2> |
|  | Output |  | IO1<1> |  |  | IO2<1> |  |
| CLK2 (180°) → | Input | IO<0> | IO<2> | IO<3> | IO1<0> | IO1<2> | IO1<3> |
|  | Output |  | IO1<2> |  |  | IO2<2> |  |
| CLK3 (270°) → | Input | IO<1> | IO<3> | IO<0> | IO1<1> | IO1<3> | IO1<0> |
|  | Output |  | IO1<3> |  |  | IO2<3> |  |

FIG. 8

|  | CHANNEL #1 ||| CHANNEL #2 |||
|---|---|---|---|---|---|---|
|  | Iset | In | Irelease | Iset | In | Irelease |
| CLK0 (0°) Input | IO<2> | IO<0> | IO<1> | IO1<2> | IO1<0> | IO1<1> |
| Output |  | IO1<0> |  |  | IO2<0> |  |
| CLK1 (60°) Input | IO<3> | IO<1> | IO<2> | IO1<3> | IO1<1> | IO1<2> |
| Output |  | IO1<1> |  |  | IO2<1> |  |
| CLK2 (120°) Input | IO<4> | IO<2> | IO<3> | IO1<4> | IO1<2> | IO1<3> |
| Output |  | IO1<2> |  |  | I/O2<2> |  |
| CLK3 (180°) Input | IO<5> | IO<3> | IO<4> | IO1<5> | IO1<3> | IO1<4> |
| Output |  | IO1<3> |  |  | IO2<3> |  |
| CLK4 (240°) Input | IO<0> | IO<4> | IO<5> | IO1<0> | IO1<4> | IO1<5> |
| Output |  | IO1<4> |  |  | IO2<4> |  |
| CLK5 (300°) Input | IO<1> | IO<5> | IO<0> | IO1<1> | IO1<5> | IO1<0> |
| Output |  | IO1<5> |  |  | IO2<5> |  |

Columns from left to right brace labels: 200, 202, 204, 206, 208, 210

FIG. 9

| | | CHANNEL #1 | | | CHANNEL #2 | | |
|---|---|---|---|---|---|---|---|
| | | Iset | In | Irelease | Iset | In | Irelease |
| CLK0 (0°) | Input | IO<5> | IO<0> | IO<3> | IO1<5> | IO1<0> | IO1<3> |
| | Output | | IO1<0> | | | IO2<0> | |
| CLK1 (45°) | Input | IO<6> | IO<1> | IO<4> | IO1<6> | IO1<1> | IO1<4> |
| | Output | | IO1<1> | | | IO2<1> | |
| CLK2 (90°) | Input | IO<7> | IO<2> | IO<5> | IO1<7> | IO1<2> | IO1<5> |
| | Output | | IO1<2> | | | IO2<2> | |
| CLK3 (135°) | Input | IO<0> | IO<3> | IO<6> | IO1<0> | IO1<3> | IO1<6> |
| | Output | | IO1<3> | | | IO2<3> | |
| CLK4 (180°) | Input | IO<1> | IO<4> | IO<7> | IO1<1> | IO1<4> | IO1<7> |
| | Output | | IO1<4> | | | IO2<4> | |
| CLK5 (225°) | Input | IO<2> | IO<5> | IO<0> | IO1<2> | IO1<5> | IO1<0> |
| | Output | | IO1<5> | | | IO2<5> | |
| CLK5 (270°) | Input | IO<3> | IO<6> | IO<1> | IO1<3> | IO1<6> | IO1<1> |
| | Output | | IO1<6> | | | IO2<6> | |
| CLK5 (315°) | Input | IO<4> | IO<7> | IO<2> | IO1<4> | IO1<7> | IO1<2> |
| | Output | | IO1<7> | | | IO2<7> | |

DUTY CYCLE DISTORTION CORRECTION CIRCUITRY

BACKGROUND

This relates generally to integrated circuits, and more particularly, to integrated circuits with clock generation circuitry.

Integrated circuits often include clock generation circuitry such as phase-locked loops (PLLs). A phase-locked loop typically has an input that receives a reference clock signal and has outputs at which multiple clocks signals are provided. The multiple clocks signals generated at the outputs of the phase-locked loop can exhibit clock rates that are integer multiples of the clock rate of the input reference clock signal.

The clock signals generated using the phase-locked loop can be distributed to different regions of an integrated circuit on which the phase-locked loop is formed using clock distribution circuitry. The clock distribution circuitry includes series-connected clock buffers (i.e., clock buffers connected serially in a chain) through which the clock signals are passed. These buffers are typically designed to provide equal rise times and fall times (i.e., equal rising and falling transition delays). A buffer exhibiting equal rise/fall times can be used to preserve the duty cycle of a clock signal that passes through that buffer. For example, a clock signal having 50% duty cycle that is received by a buffer exhibiting equal rise/fall times will exhibit 50% duty cycle at that buffer's output.

In practice, however, buffers and other circuits that are used to propagate clock signals may suffer from process, voltage, and temperature variations and may therefore exhibit unequal rise and fall times (i.e., mismatched rising and falling transition delays). Clock signals passing through buffers with mismatched rise/fall times will suffer from duty cycle distortion. For example, a clock signal having 50% duty cycle that is received by a buffer exhibiting mismatched rise/fall times may exhibit 60% duty cycle at that buffer's output.

Clock buffers are typically designed to provide stronger pull-up drive strengths and relatively weaker pull-down drive strengths. Clock signals passing through such types of clock buffers may experience fast rising transitions and relatively slower falling transitions. As a result, the duty cycle of the clock signals tend to increase as they are passed through each successive clock buffer. In some scenarios, clock signals that originally exhibit 50% duty cycle (i.e., clock signals that exhibit 50% duty cycle at the output of the phase-locked loop) may gradually approach 100% duty cycle as they are propagated through the clock buffer chain and may eventually be stuck high, thereby rendering the integrated circuit inoperable.

SUMMARY

Integrated circuits may include clock generation circuits such as phase-locked loops. A phase-locked loop may be used to generate multiple clock signals that are offset in phase with respect to one another. The multiple clock signals may be routed to different portions of an integrated circuit using at least one chain of clock buffer blocks.

Each clock buffer block may include bidirectional pairs of clock buffer circuits coupled in parallel. Clock buffer block may, as an example, include eight bidirectional pairs of clock buffer circuits for supporting operation of an eight clock phase system (e.g., a system in which the phase-locked loop is configured to generate eight clock signals that are delayed versions of one another).

Each clock buffer circuit in a given clock buffer block may have a first input terminal operable to receive an input clock signal, an output terminal at which a corrected version of the input clock signal is provided (e.g., an output at which an output clock signal with the desired duty cycle is provided), a second input terminal operable to receive a first delayed clock signal (e.g., a first delayed version of the input clock signal), and a third input terminal operable to receive a second delayed clock signal (e.g., a second delayed version of the input clock signal). The first and second delayed clock signals may be selected from the multiple clock signals generated at the output of a preceding clock buffer block in the buffer chain.

When the input clock signal clocks high, the output clock signal will rise high. The rising clock edge of the first delayed clock signal will cause the clock buffer circuit to drive the output clock signal low. The amount of phase offset between the input clock signal and the first delayed clock signal may therefore serve to set the high clock phase of the output clock signal.

The second delayed clock signal may be selected such that the second delayed clock signal rises high in a first time period during which the first delayed clock signal is low and such that the second delayed signal falls low in a second time period during which the input clock signal is low (e.g., the second delayed clock signal should be high surrounding the rising clock edge of the first delayed clock signal). When the second delayed clock signal is high, the falling transition of the output clock signal will be triggered by the rising clock edge of the first delayed clock signal rather than the falling clock edge of the input clock signal, which effectively desensitizes the buffer circuit to any existing duty cycle distortion in the input clock signal.

When the input clock signal rises again, the output clock signal will rise high to complete the current clock cycle. Buffering clock signals in this way may effectively generate duty-cycle-distortion-corrected output clock signals (e.g., generate output clock signals with the desired duty cycle).

Further features of the present invention, its nature and various advantages will be more apparent from the accompanying drawings and the following detailed description.

BRIEF DESCRIPTION OF THE DRAWINGS

FIG. 8 is a table showing illustrative connections among different clock buffers for providing 50% duty cycle correction in a four clock phase system in accordance with an embodiment of the present invention.

FIG. 9 is a table showing illustrative connections among different clock buffers for providing 33% duty cycle correction in a six clock phase system in accordance with an embodiment of the present invention.

FIG. 10 is a table showing illustrative connections among different clock buffers for providing 62.5% duty cycle correction in an eight clock phase system in accordance with an embodiment of the present invention.

DETAILED DESCRIPTION

Embodiments of the present invention relate to integrated circuits with clock generation and distribution circuitry. Such types of integrated circuits may include digital signal processors, microprocessors, application-specific integrated circuits, programmable integrated circuits such as programmable logic devices, etc.

Figure 1:
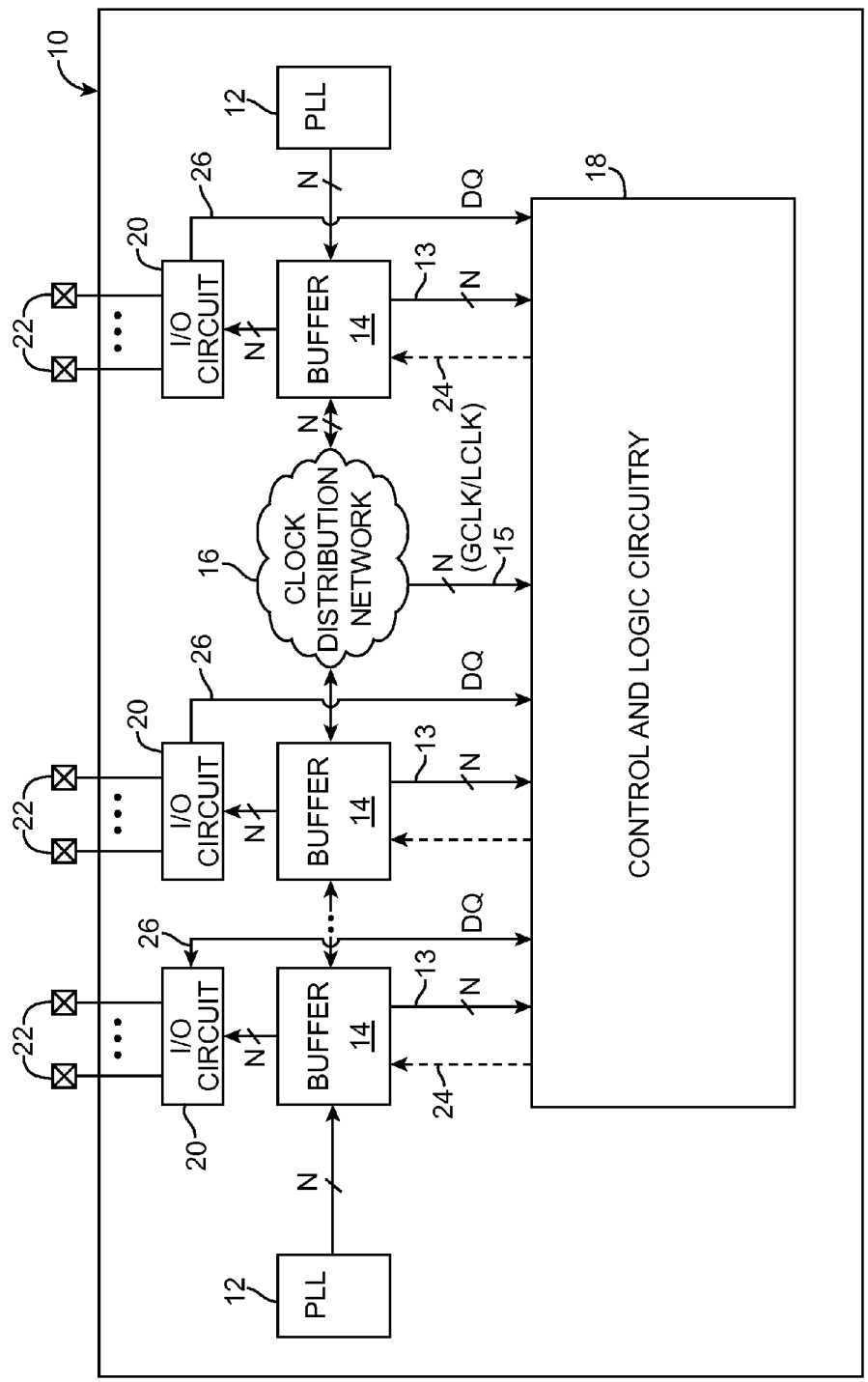
FIG. 1 is a diagram of an illustrative integrated circuit with clock buffer circuitry in accordance with an embodiment of the present invention.

FIG. 1 is a diagram of an illustrative integrated circuit device 10 that includes control and logic circuitry 18 and clock generation circuitry such as phase-locked loops (PLLs) 12. Circuitry 18 may include latches, combinational logic circuits, sequential logic circuits, and control circuitry operable to control other parts of device 10. The logic in circuitry 18 may be organized using any suitable architecture. As an example, the logic may be organized in a series of rows and columns of larger logic regions each of which contains multiple smaller logic regions.

The smaller regions may be, for example, regions of logic that are sometimes referred to as logic elements (LEs), each containing a look-up table, one or more registers, and configurable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (as an example). The larger regions may be, for example, regions of logic sometimes referred to as logic array blocks (LABs) containing multiple LEs or multiple ALMs. In a typical integrated circuit 10, circuitry 18 may include tens or hundreds of larger logic regions, each of which includes hundreds or thousands of smaller logic regions. If desired, the logic of device 10 may be arranged in more levels or layers in which multiple large regions are interconnected to form still larger portions of logic. Still other device arrangements may use logic that is not arranged in rows and columns.

Each phase-locked loop 12 may be configured to generate multiple clock signals each having a respective clock phase. In the example of FIG. 1, device 10 includes two phase-locked loops 12 each configured to generate N respective clock signals. In general, device 10 may include any desired number of phase-locked loops each of which is configured to generate any suitable number of clock signals.

The clock signals generated using phase-locked loops 12 may be distributed to the different logic regions on device 10 using clock buffer blocks 14 and clock distribution network 16. Clock buffer blocks 14 may be coupled in a chain so that the clock signals can be driven from one portion of device 10 to another portion of device 10 while experiencing minimal signal propagation delay. Clock buffer blocks 14 may have bidirectional driving capabilities so that clock signals can be driven in either direction along the chain. Each buffer block 14 in the clock buffer chain may have a control input that receives control settings from control circuitry 18 via path 24 (i.e., settings that configure each buffer block to provide desired drive strengths) and may have an output over which the clock signals may be conveyed to corresponding portions of logic circuitry 18 via path 13.

Clock distribution network 16 may include additional branches of serially connected buffer blocks 14 and conductive routing paths arranged in a tree configuration (as an example). Clock distribution network 16 may, for example, be an H-tree clock network configured to ensure that delays to the different logic regions of circuitry 18 are well matched (e.g., so that the clock signals arrive synchronously at the different regions). Clock distribution network 16 may generally include vertical and horizontal conductors. These conductors may include global conductive lines that span substantially all of device 10, fractional lines such as half lines or quarter lines that span part of device 10, smaller local lines, or other suitable interconnection resources arrangements. Buffered clock signals that are routed to different regions of circuitry 18 using the global conductive lines are referred to as global clock signals GCLK, whereas clock signals that are routed to particular regions of circuitry 18 using the smaller local lines are referred to as local clock signals LCLK (see, e.g., conductive lines 15 in FIG. 1).

Integrated circuit 10 may also include input-output (I/O) circuits such as I/O circuits 20 that are used for driving signals off of device 10 and for receiving signals from other devices via I/O pins 22. Input-output circuit 20 may include circuits such as analog-to-digital converting (ADC) circuits, clock and data recovery (CDR) circuits, double data rate (DDR) conversion circuits, dynamic phase alignment (DPA) circuits, serial-parallel interface (SPI) interface circuits, and other input-output circuits. Such types of input-output circuits may be controlled using clock signals generated by associated clock buffer blocks 14 and may be sensitive to the accuracy and consistency of the clock signals. For example, the performance of an I/O circuit 20 may be degraded if the clock signals it receives suffer undesirably from duty cycle distortion.

As shown in FIG. 1, each input-output circuit 20 may be coupled to an associated buffer block 14 (e.g., each circuit 20 may be controlled by clock signals generated from the associated buffer block) and may serve to convey data signals (DQ) between a corresponding logic circuit in circuitry 18 and an external device via associated path 26 and pins 22. Each input-output circuit 20 may be coupled to at least one pin 22, at least four pins 22, at least eight pins 22, etc. Each pair of I/O circuit 26 and associated clock buffer clock 14 may serve to perform data transfer for a respective data channel. If desired, device 10 may be configured to support data transfer for any number of channels.

Figure 2:
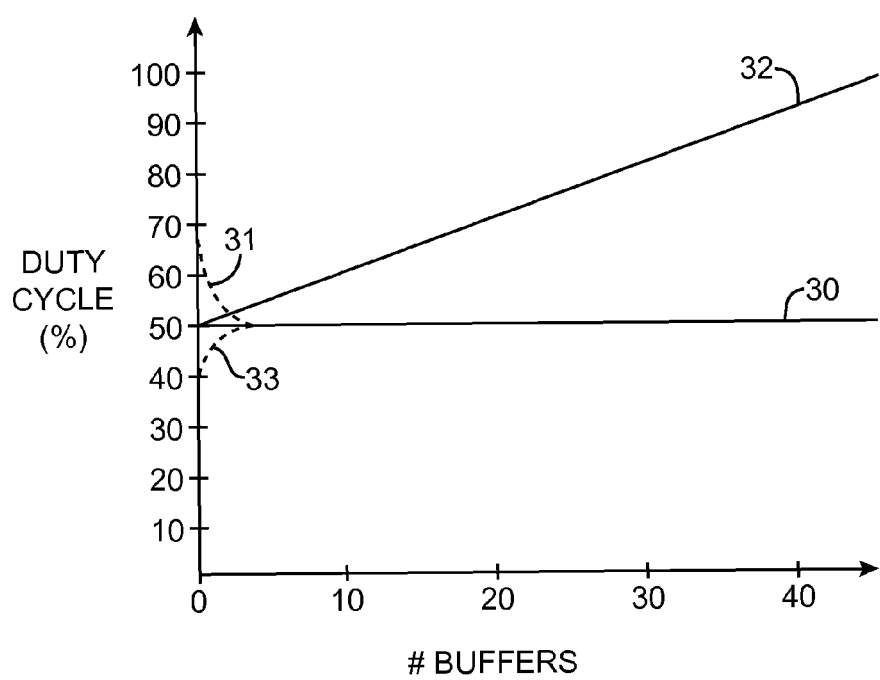
FIG. 2 is a graph of duty cycle versus the number of clock buffers in accordance with an embodiment of the present invention.

Clock buffer circuits that exhibit equal rise and fall times may be used to minimize duty cycle distortion (e.g., clock buffer circuits that provide equal rising and falling transition delays may be used to preserve clock signal duty cycles). FIG. 2 is a graph plotting duty cycle versus the length of the clock buffering chain. Line 32 plots the duty cycle of a clock signal propagating through a chain of clock buffers suffering from mismatched rise and fall times, whereas line 30 plots the duty cycle of a clock signal propagating through a chain of clock buffers exhibiting equal rise/fall times.

In the example of FIG. 2, line 32 plots the duty cycle of a clock signal originally exhibiting a 50% duty cycle propagating through a chain of clock buffers exhibiting shorter rising transitions and relatively longer falling transitions. As indicated by line 32, the duty cycle may gradually distort towards 100% as the clock signal is propagated through successive clock buffers suffering from weaker fall times. In contrast, the duty cycle of the clock signal passing through the chain of clock buffers exhibiting equal rise/fall delays remains constant at 50% (as shown by line 30).

Clock buffer circuits that provide equal rise/fall times, however, do not correct the duty cycle of a clock signal that has already suffered from duty cycle distortion because these clock buffer circuits, which are capable of preserving the duty cycle, are not capable of altering the duty cycle towards any target level. It may therefore be desirable for clock buffer circuits to be capable of correcting any existing duty cycle distortion.

For example, consider a scenario in which a clock signal originally exhibits an unsatisfactory duty cycle of 70% (e.g., assuming that the target duty cycle is 50%). The clock signal may be passed through a chain of clock buffers configured to provide 50% duty cycle correction. As indicated by line 31 in FIG. 2, the duty cycle of original clock signal is corrected towards the target duty cycle after passing the clock signal through the clock buffer chain configured to provide 50% duty cycle correction.

Consider another scenario in which a clock signal originally exhibits an unsatisfactory duty cycle of 40% (e.g., assuming that the target duty cycle is 50%). The clock signal may be passed through a chain of clock buffers configured to provide 50% duty cycle correction. As indicated by line 33 in FIG. 2, the duty cycle of original clock signal is corrected towards the target duty cycle after passing the clock signal through the clock buffer chain configured to provide 50% duty cycle correction. A target duty cycle of 50% is merely illustrative. Each clock buffer block 14 of the type described in connection with FIG. 2 may be configured to correct the duty cycle of clock signals to any desired duty cycle.

Figure 3:
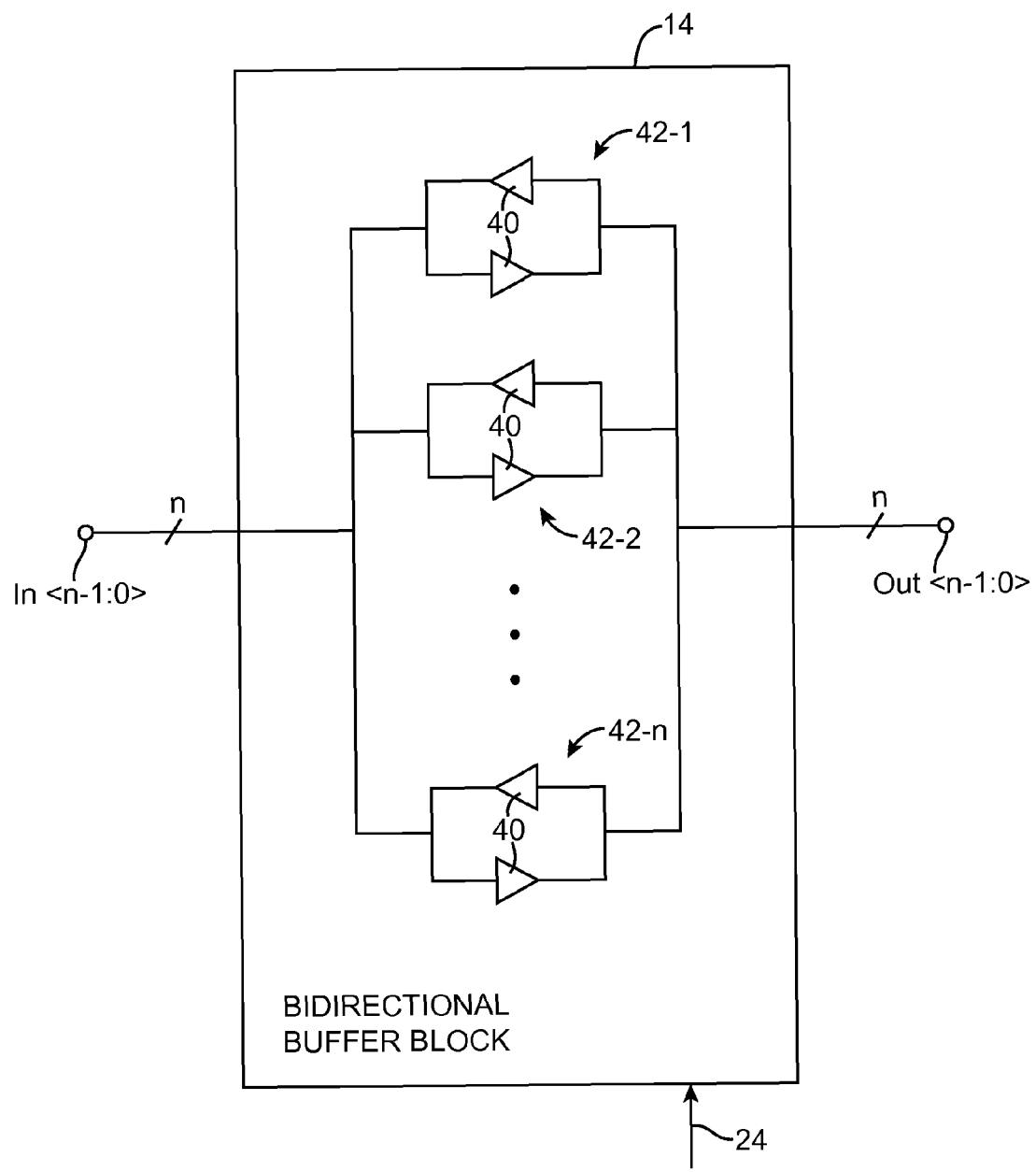
FIG. 3 is a diagram of illustrative bidirectional clock buffer circuitry in accordance with an embodiment of the present invention.

FIG. 3 is a diagram of bidirectional clock buffer block 14 having an n-bit wide input port In<n−1:0> and an n-bit wide output port Out<n−1:0>. Buffer block 14 may include n cross-coupled pairs of buffer circuits 40. Each buffer pair in the n pairs of buffer circuit may be configured to provide the same amount of duty cycle distortion correction or may be configured to provide different amounts of duty cycle distortion correction. A first buffer circuit 40 in a pair of cross-coupled buffer circuits may be used to drive a clock signal from a selected terminal at port In to a corresponding terminal at port Out, whereas a second buffer circuit 40 in the pair of cross-coupled buffer circuits may be used to drive a clock signal from the corresponding terminal at port Out to the selected terminal at port In. The terms input and output for clock buffer block 14 may be used interchangeably because of its bidirectional drive-ability and may sometimes therefore be referred to as input-output terminals.

Buffer block 14 may include a first clock buffer pair 42-1, a second clock buffer pair 42-2, and so forth up to an $n^{th}$ clock buffer pair 42-n. The first pair of buffer circuits 40 may be coupled between In<0> and Out<0>, the second pair of buffer circuits 40 may be coupled between In<1> and Out<1>, . . . , and the $n^{th}$ pair of buffer circuits 40 may be coupled between In<n−1> and Out<n−1>.

In scenarios in which clock signals are driven from the input port to the output port, clock signals may arrive at In<n−1:0> and may be output at Out<n−1:0>. Consider a first scenario in which device 10 is used in a system that requires phased-locked loop 12 to generate clock signals with four respective clock phases (e.g., a scenario in which device 10 is configured to operate in a four clock phase system). In a four phase system (n=4), PLL 12 may be used to generate a first clock signal, a second clock signal that is a delayed version of the first clock signal (i.e., the second clock signal may be delayed by 90° phase with respect to the first clock signal), a third clock signal that is a delayed version of the second clock signal (i.e., the second clock signal may be delayed by 180° phase with respect to the first clock signal), and a fourth clock signal that is a delayed version of the third clock signal (i.e., the fourth clock signal may be delayed by 270° phase with respect to the first clock signal). Each of the four clock signals may clock at a common frequency. In this scenario in which n is equal to 4, In<0> may receive the first clock signal, In<1> may receive the second clock signal, In<2> may receive the third clock signal, and In<3> may receive the fourth clock signal.

Consider a second scenario in which device 10 is used in a system that requires phased-locked loop 12 to generate clock signals with six respective clock phases (e.g., a scenario in which device 10 is configured to operate in a six clock phase system). In a six phase system (n=6), PLL 12 may be used to generate a first clock signal, a second clock signal that is a delayed version of the first clock signal (i.e., the second clock signal may be delayed by 60° phase with respect to the first clock signal), a third clock signal that is a delayed version of the second clock signal (i.e., the second clock signal may be delayed by 120° phase with respect to the first clock signal), a fourth clock signal that is a delayed version of the third clock signal (i.e., the fourth clock signal may be delayed by 180° phase with respect to the first clock signal), a fifth clock signal that is a delayed version of the fourth clock signal (i.e., the fifth clock signal may be delayed by 240° phase with respect to the first clock signal), a sixth clock signal that is a delayed version of the fifth clock signal (i.e., the sixth clock signal may be delayed by 300° phase with respect to the first clock signal). Each of the six clock signals may clock at a common frequency. In this scenario in which n is equal to 6, In<0> may receive the first clock signal, In<1> may receive the second clock signal, In<2> may receive the third clock signal, In<3> may receive the fourth clock signal, In<4> may receive the fifth clock signal, and In<5> may receive the sixth clock signal. In general, buffer block 14 may be configured to accommodate any number of input clock signals.

Figure 4:
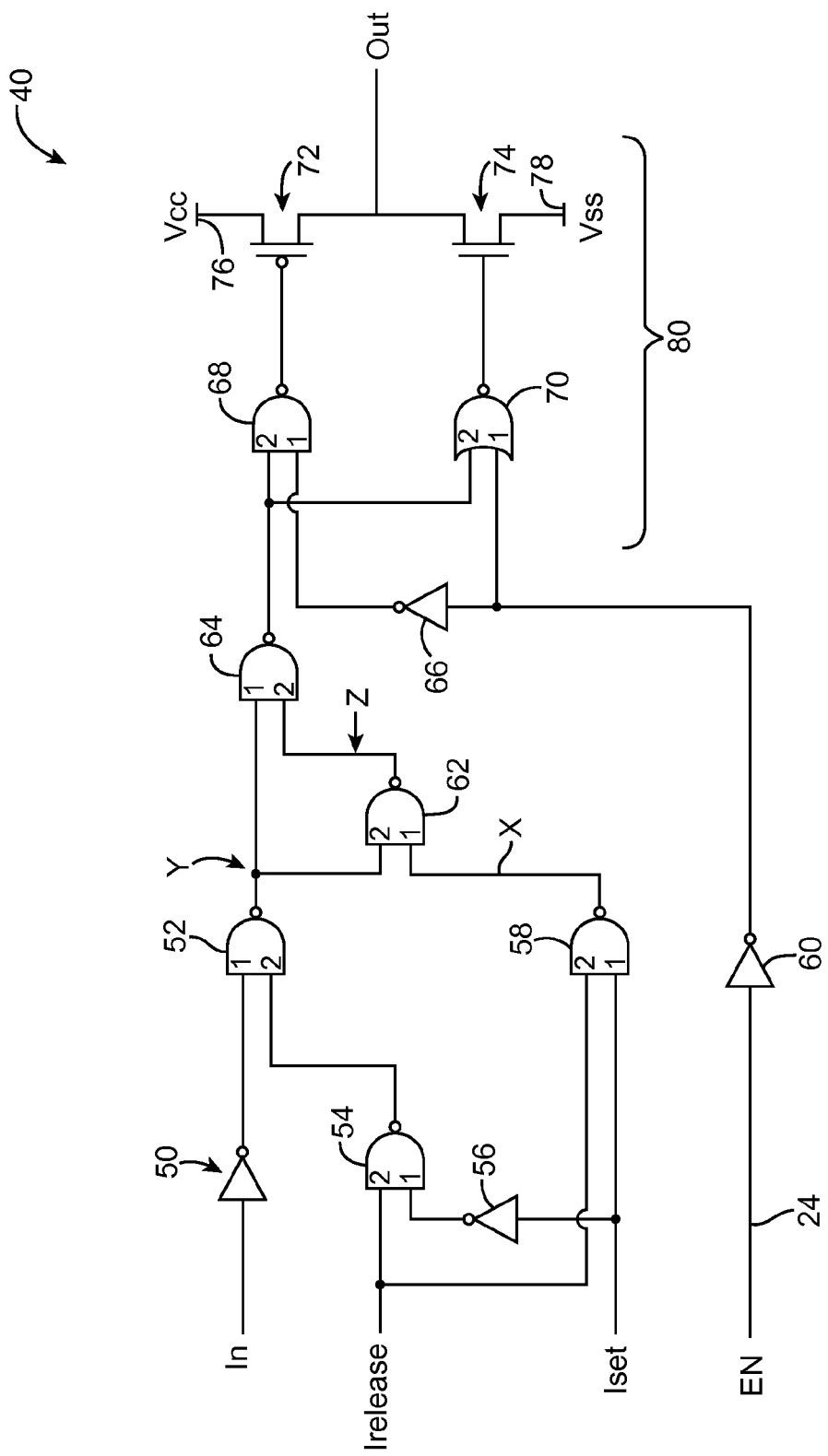
FIG. 4 is a circuit diagram of an illustrative clock buffer circuit in accordance with an embodiment of the present invention.

FIG. 4 is a circuit diagram of an illustrative clock buffer circuit 40. As shown in FIG. 4, clock buffer circuit 40 may include input terminals In, Irelease, Iset, and EN and an output terminal Out. Clock buffer circuit 40 may include transistors such as p-channel transistor 72 (e.g., a p-channel metal-oxide-semiconductor device) and re-channel transistor 74 (e.g., an n-channel metal-oxide-semiconductor device) and logic circuits such as inverters 50, 56, 60, and 66, logic NAND gates 52, 54, 62, and 68, logic AND gates 58 and 68, and logic NOR gate 70.

Inverter 50 may have an input coupled to terminal In and an output that is coupled to a first input of logic NAND gate 52. Inverter 56 may have an input coupled to terminal Iset and an output that is coupled to a first input of logic NAND gate 54. Gate 54 may have a second input that is coupled to terminal Irelease and an output that is coupled to a second input of gate 52.

Logic AND gate 58 may have a first input that is coupled to terminal Iset, a second input that is coupled to terminal Irelease, and an output that is coupled to a first input of NAND gate 62. Gate 62 may have a second input that is coupled to an output of gate 52 and an output. Gate 64 may have a first input that is coupled to the output of gate 52, a second input that is coupled to the output of gate 62, and an output.

Inverter 60 may have an input that is coupled to terminal EN and an output that is coupled to a first input of logic NOR gate 70. The output of inverter 60 may also be coupled to a first input of NAND gate 68 via inverter 66. The output of gate 64 may be coupled to a second input of gate 68 and a second input of gate 70.

P-channel transistor 72 and n-channel transistor 74 may be coupled in series between a first power supply line 76 (e.g., a positive power supply line on which positive power supply voltage Vcc is provided) and a second power supply line 78 (e.g., a ground power supply line on which ground power supply voltage Vss is provided). Voltage Vcc may be equal to 1 V, 0.85 V, or other suitable positive power supply voltage, whereas voltage Vss may be equal to zero volts, 0.1 V, −0.1 V, or other suitable ground/negative power supply voltage. Transistor 72 may have a gate that is coupled to an output of gate 68, whereas transistor 74 may have a gate that is coupled to an output of gate 70. The node at which transistors 72 and 74 are connected may serve as terminal Out for clock buffer circuit 40.

Input terminal EN may receive a control signal from control circuitry 18 via path 24 (see, e.g., FIG. 1). This control signal may be used to enable or disable circuit (e.g., to place circuit 40 in active drive mode or tri-state floating mode). For example, if the control signal is low, a high voltage signal will be presented at the first input of NOR gate 70 while a low voltage signal will be presented at the first input of NAND gate 68. The high voltage at the first input of gate 70 will force the output of gate 70 low, to turn off pull-down transistor 74. The low voltage at the first input of gate 68 will force the output of gate 68 high to turn off pull-up transistor 72. Place both transistors 72 and 74 in the off state in this way may therefore result in terminal Out being undriven, thereby effectively disabling buffer 40.

When the control signal is high, a low voltage signal will be presented at the first input of NOR gate 70 while a high voltage signal will be presented at the first input of NAND gate 68. The low voltage at the first input of gate 70 will effectively configure gate 70 to invert the signal level received at its second input. Similarly, the high voltage at the first input of gate 68 will effectively configure gate 68 to invert the signal level received at its second input. Because the output of gate 64 is connected to both the second input of gate 68 and the second input of gate 70, gates 68 and 70 will collectively operate as a first inverting stage that inverts whatever voltage it sees at the output of gate 64. Because transistors 72 and 74 act as a second inverting stage following the first inverting stage, logic gates 80 (i.e., logic circuits that make up the first and second inverting stage) may collectively operate as a buffer stage that passes whatever voltage level it sees at the output of gate 64 to terminal Out, thereby enabling buffer circuit 40 to operate in normal buffer mode.

Terminal In may serve as the main input for clock buffer 40, whereas terminals Iset and Irelease may be used as auxiliary inputs. Clock buffer 40 may, for example, receive an input clock signal suffering from duty cycle distortion at terminal In and may be configured to output a corresponding output clock signal exhibiting desired duty cycle at terminal Out (i.e., buffer 40 may be configured to provide desired duty cycle distortion correction).

Terminals Iset and Irelease may be configured to receive different delayed version of the input clock signal. In particular, the clock signal that is fed to Iset may be chosen based on a target duty cycle (e.g., a desired duty cycle to which the clock signal that is output by clock buffer 40 should be corrected). The clock signal that is fed to Irelease may be based on the clock signal selected for Iset.

Figure 5:
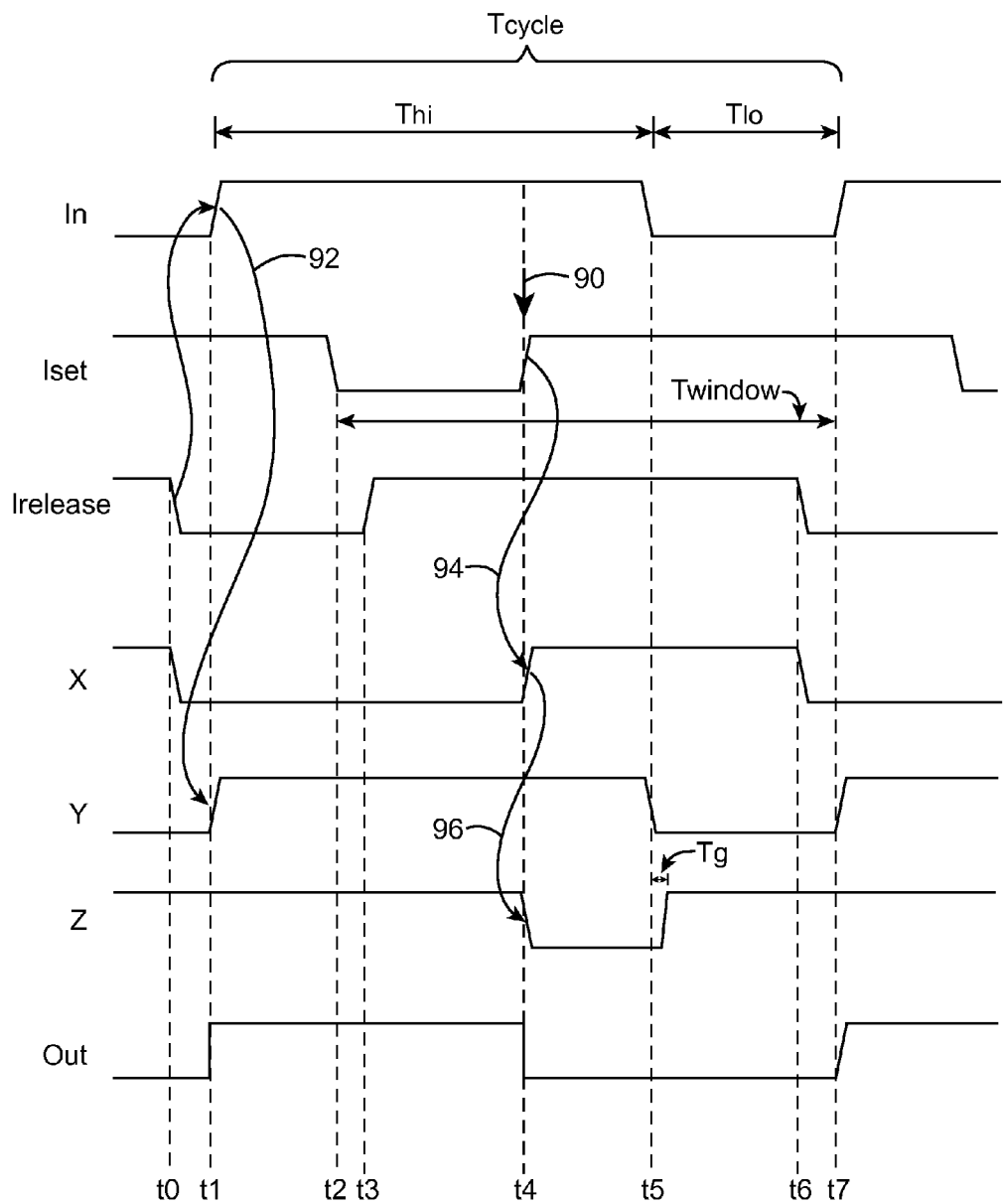
FIG. 5 is a timing diagram illustrating the operation of the clock buffer circuit of FIG. 4 in accordance with an embodiment of the present invention.

The operation of circuit 40 can be illustrated in the timing diagram of FIG. 5. Assume in this scenario that the desired duty cycle is equal to 50%. In the example of FIG. 5, terminal In receives an input clock signal exhibiting a unsatisfactory duty cycle of 70% (e.g., high clock phase duration Thi is equal to 70% of clock period Tcycle, whereas low clock phase duration Tlo is equal to 30% of Tcycle). Terminal Iset may be configured to receive a delayed version of the input clock signal (referred to herein as a first delayed clock signal), wherein the first delayed clock signal is strategically selected such that its rising clock edges transitions at the center of Tcycle, as indicated by arrow 90 (for providing 50% duty cycle correction). In general, buffer circuit 40 may be configured to output clock signals with any desired target duty cycle by carefully positioning the rising clock edge of the first delayed clock signal received at terminal Iset.

Terminal Irelease may also be configured to receive a delayed version of the input clock signal (referred to herein as a second delayed clock signal), wherein the second delayed clock signal is positioned such that it clocks high in periods during which the first delayed clock signal is low and clocks low in periods during which the input clock signal is low. The second delayed clock signal may serve as a release signal that allows the output clock signal (i.e., the output signal generated at terminal Out) to fall when the first delayed clock signal clocks high and to rise when the input clock signal rises high.

To more clearly illustrate the functionality of clock buffer circuit 40, signal waveforms at internal nodes X, Y, and Z are also plotted in FIG. 5 (see, e.g., FIG. 4). Node X may refer to the output path of gate 58. Node Y may refer to the output path of gate 52. Node Z may refer to the output path of gate 62. The voltage level at node X may be equal to the current value of the first delayed clock signal ANDed with the current value of the second delayed clock signal. The voltage level at node Z may be equal to the current level at node X NANDed with the current level at node Y. The voltage level at terminal Out may therefore be equal to the current level at node Y ANDed with the current level at node Z (assuming buffer circuit 40 is not in tri-state mode).

At time t0, the second delayed clock signal at Irelease clocks low, causing the voltage at node X to fall low. The main input clock signal at In may subsequently clock high (at time t1), thereby causing the voltage at node Y to rise, as indicated by arrow 92. Because the voltage of node Z is high at this time, this rising clock edge will be propagated to terminal Out to clock the output clock signal high.

At time t2, the first delayed clock signal at Iset may clock low. At time t3, the second delayed clock signal at Irelease may clock high (e.g., the second delayed clock signal should only clock high while the first delayed clock signal is low). Changes to the first and second delayed clock signals at times t2 and t3 do not affect the output clock signal.

At time t4, the first delayed clock signal at Iset clocks high, causing the voltage at node X to rise high (as indicated by arrow 94). This rise at node X may result in the voltage at node Z to fall low, as indicated by arrow 96 (at time t4, the voltage at node Y is high so any transition at node X will be inversely reflected at node Z). Because the voltage of node Y is high at this time, this falling clock edge at node Z will be propagated to terminal Out to clock the output clock signal low. The position of the rising clock edge of the first delayed clock signal at terminal Iset may therefore set the resulting duty cycle of the output clock signal (see, e.g., arrow 90).

At time t5, the main input clock signal may clock low, thereby causing the voltage at node Y to fall low. The voltage at node Z may subsequently transition high after propagation delay Tg of gate 62 after time t5. Note that the falling clock edge at time t5 is not propagated to terminal Out because the voltage at nodes Y and Z are different from a first point in time immediately before time t5 to a second point in time immediately after time t5.

At time t6, the second delayed clock signal at Irelease clocks low, causing the voltage at node X to fall low. The main input clock signal at In may subsequently clock high (at time t7), thereby causing the voltage at node Y to rise high. Because the voltage of node Z is high at this time, this rising clock edge will be propagated to terminal Out to clock the output clock signal high. It may therefore be desirable to select the second delayed clock signal such that the second delayed clock signal is only high after the falling clock edge of the first delayed clock signal at time t2 and before the rising clock edge of the input clock signal at time t7 (e.g., the high clock phase of the second delayed clock signal should be positioned within time period Twindow).

As shown in FIG. 5, the output clock signal at terminal Out may exhibit a corrected duty cycle of 50%. Generating an output clock signal by driving the output clock signal high in response to detecting a rising clock edge in the input clock signal and by driving the output clock signal low in response to detecting a rising clock edge in the first delayed clock signal (i.e., a clock signal that is delayed with respect to the input clock signal by a predetermined amount) may effectively provide desired duty cycle distortion correction for the output clock signal.

Figure 6:
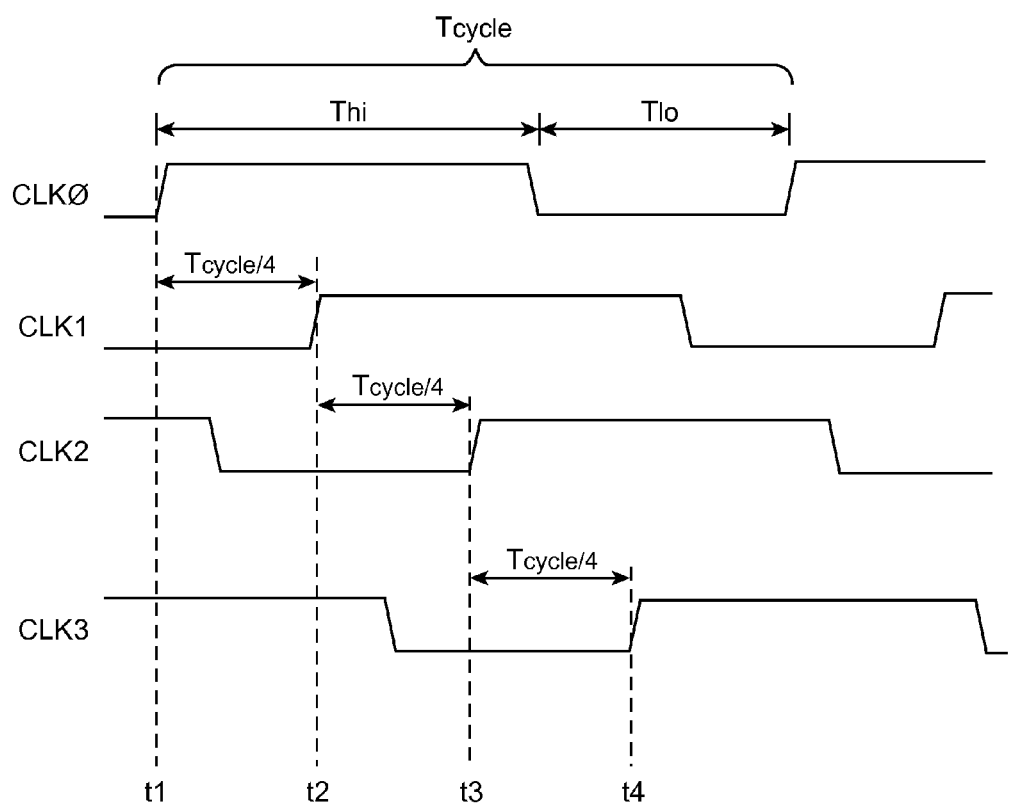
FIG. 6 is a timing diagram of clock signals that are generated by a clock generation circuit in a four clock phase system in accordance with an embodiment of the present invention.

FIG. 6 shows different clock signals that may be generated by phase-locked loop 12 in a four clock phase system. As shown in FIG. 6, phase-locked loop 12 may generate first clock signal CLK0, second clock signal CLK1, third clock signal CLK2, and fourth clock signal CLK3. The first clock signal CLK0 may serve as a reference clock sometimes referred to as having zero degree phase delay. The second clock signal CLK1 may be delayed by a quarter Tcycle with respect to CLK0 (e.g., a clock signal that exhibits 90° phase delay (360/4*1) relative to CLK0). The third clock signal CLK2 may be delayed by a half Tcycle with respect to CLK0 (e.g., a clock signal that exhibits 180° phase delay (360/4*2) relative to CLK0). The fourth clock signal CLK3 may be delayed by three-quarters of Tcycle with respect to CLK0 (e.g., a clock signal that exhibits 270° phase delay (360/4*3) relative to CLK0). Each of the four clock signals CLK0-CLK3 may exhibit the same duty cycle.

In the example of FIG. 6, clock signals CLK0-3 may exhibit approximately 60% duty cycle. Consider a first scenario in which the target duty cycle is 50%. To correct the duty cycle distortion of CLK0, a first buffer circuit 40 may be configured to receive CLK0 at its input terminal In, to receive CLK2 at its input terminal Iset (because CLK2 is offset by 180° phase with respect to CLK0), and to receive CLK1 at its input terminal Irelease (because CLK1 is high surrounding the rising clock edges of CLK2). To correct the duty cycle distortion of CLK1, a second buffer circuit 40 may be configured to receive CLK1 at its input terminal In, to receive CLK3 at its input terminal Iset (because CLK3 is offset by 180° phase with respect to CLK1), and to receive CLK2 at its input terminal Irelease (because CLK2 is high surrounding the rising clock edges of CLK3). To correct the duty cycle distortion of CLK2, a third buffer circuit 40 may be configured to receive CLK2 at its input terminal In, to receive CLK0 at its input terminal Iset (because CLK0 is offset by 180° phase with respect to CLK2), and to receive CLK3 at its input terminal Irelease (because CLK3 is high surrounding the rising clock edges of CLK0). To correct the duty cycle distortion of CLK3, a fourth buffer circuit 40 may be configured to receive CLK3 at its input terminal In, to receive CLK1 at its input terminal Iset (because CLK1 is offset by 180° phase with respect to CLK3), and to receive CLK0 at its input terminal Irelease (because CLK0 is high surrounding the rising clock edges of CLK1).

Figure 7:
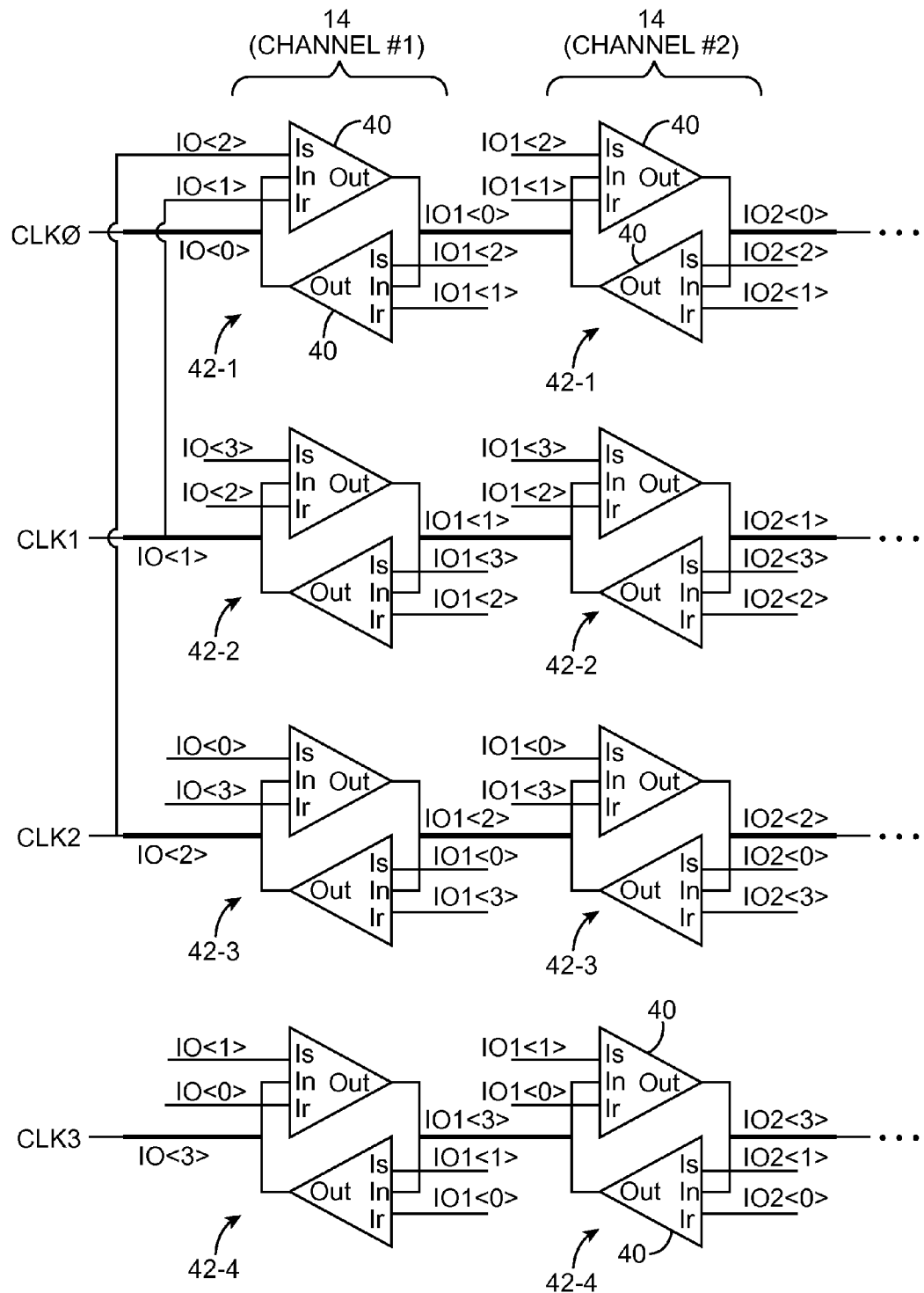
FIG. 7 is a diagram of illustrative bidirectional block buffer circuitry in a four clock phase system in accordance with an embodiment of the present invention.

FIG. 7 is a schematic circuit diagram showing the various connections that can be made for the four pairs of bidirectional buffer circuits in buffer blocks 14 in providing the 50% duty cycle correction for a four clock phase system. As shown in FIG. 7, each clock buffer circuit 40 may include input terminals In, Is (short for Iset), and Ir (short for Irelease) and an output terminal Out. The various connection points are labeled generically as input-output nodes IO<i> since any given path may be considered an input path when buffer block 14 is used to pass clock signals in a first direction or may be considered an output path when buffer block 14 is used to pass clock signals in a second direction that is opposite to the first direction. Clock buffer circuit 40 in any given channel may be configured to receive clock signals routed from an output of clock buffer circuit 40 located in an immediately preceding buffer block 14 in the buffer chain (e.g., a buffer circuit 40 in channel #2 may only be coupled to a selected one of the four outputs associated with channel #1). The detailed connections shown in FIG. 7 may be summarized in a table, as shown in FIG. 8.

Consider another scenario in which buffer circuit 40 is used to correct duty cycle distortion in a six clock phase system. In the six clock phase system, phase-locked loop 12 may be configured to generate six clock signals CLK0-CLK5. First clock signal CLK0 may serve as a reference clock sometimes referred to as having zero degree phase delay. Second clock signal CLK1 may be delayed by Tcycle/6 with respect to CLK0 (e.g., a clock signal that exhibits 60° phase delay (360/6*1) relative to CLK0). Third clock signal CLK2 may be delayed by Tcycle/3 with respect to CLK0 (e.g., a clock signal that exhibits 120° phase delay (360/6*2) relative to CLK0). Fourth clock signal CLK3 may be delayed by Tcycle/2 with respect to CLK0 (e.g., a clock signal that exhibits 180° phase delay (360/6*3) relative to CLK0). Fifth clock signal CLK4 may be delayed by Tcycle*2/3 with respect to CLK0 (e.g., a clock signal that exhibits 240° phase delay (360/6*4) relative to CLK0). Sixth clock signal CLK5 may be delayed by Tcycle*5/6 with respect to CLK0 (e.g., a clock signal that exhibits 300° phase delay (360/6*5) relative to CLK0). Each of the six clock signals CLK0-CLK5 may exhibit the same duty cycle.

To achieve a target duty cycle of 33.3%, buffer circuits 40 in buffer block 14 may be interconnected using a routing configuration summarized in the table of FIG. 9 (as an example). To correct the duty cycle distortion of CLK0, a first buffer circuit 40 may be configured to receive CLK0 at its input terminal In, to receive CLK2 at its input terminal Iset (because CLK2 is offset by 120° phase with respect to CLK0), and to receive CLK1 at its input terminal Irelease (see, rows 200). To correct the duty cycle distortion of CLK1, a second buffer circuit 40 may be configured to receive CLK1 at its input terminal In, to receive CLK3 at its input terminal Iset (because CLK3 is offset by 120° phase with respect to CLK1), and to receive CLK2 at its input terminal Irelease (see, rows 202). To correct the duty cycle distortion of CLK2, a third buffer circuit 40 may be configured to receive CLK2 at its input terminal In, to receive CLK4 at its input terminal Iset (because CLK4 is offset by 120° phase with respect to CLK2), and to receive CLK3 at its input terminal Irelease (see, rows 204). To correct the duty cycle distortion of CLK3, a fourth buffer circuit 40 may be configured to receive CLK3 at its input terminal In, to receive CLK5 at its input terminal Iset (because CLK5 is offset by 120° phase with respect to CLK3), and to receive CLK4 at its input terminal Irelease (see, rows 206). To correct the duty cycle distortion of CLK4, a fifth buffer circuit 40 may be configured to receive CLK4 at its input terminal In, to receive CLK0 at its input terminal Iset (because CLK0 is offset by 120° phase with respect to CLK4), and to receive CLK5 at its input terminal Irelease (see, rows 208). To correct the duty cycle distortion of CLK5, a sixth buffer circuit 40 may be configured to receive CLK5 at its input terminal In, to receive CLK1 at its input terminal Iset (because CLK1 is offset by 120° phase with respect to CLK5), and to receive CLK0 at its input terminal Irelease (see, rows 210).

The configuration described in connection with FIG. 9 is merely illustrative. If desired, the six buffer circuits 40 may be configured to provide 50% duty cycle correction, 66% duty cycle correction, etc.

Consider another scenario in which buffer circuit 40 is used to correct duty cycle distortion in an eight clock phase system. In the eight clock phase system, phase-locked loop 12 may be configured to generate eight clock signals CLK0-CLK7. First clock signal CLK0 may serve as a reference clock sometimes referred to as having zero degree phase delay. Second clock signal CLK1 may be delayed by Tcycle/8 with respect to CLK0 (e.g., a clock signal that exhibits 45° phase delay (360/8*1) relative to CLK0). Third clock signal CLK2 may be delayed by Tcycle/4 with respect to CLK0 (e.g., a clock signal that exhibits 90° phase delay (360/8*2) relative to CLK0). Fourth clock signal CLK3 may be delayed by Tcycle*3/8 with respect to CLK0 (e.g., a clock signal that exhibits 135° phase delay (360/8*3) relative to CLK0). Fifth clock signal CLK4 may be delayed by Tcycle*2 with respect to CLK0 (e.g., a clock signal that exhibits 180° phase delay (360/8*4) relative to CLK0). Sixth clock signal CLK5 may be delayed by Tcycle*5/8 with respect to CLK0 (e.g., a clock signal that exhibits 225° phase delay (360/8*5) relative to CLK0). Seventh clock signal CLK6 may be delayed by Tcycle*3/4 with respect to CLK0 (e.g., a clock signal that exhibits 270° phase delay (360/8*6) relative to CLK0). Eighth clock signal CLK7 may be delayed by Tcycle*7/8 with respect to CLK0 (e.g., a clock signal that exhibits 315° phase delay (360/8*7) relative to CLK0). Each of the eight clock signals CLK0-CLK7 may exhibit the same duty cycle.

To achieve a target duty cycle of 62.5%, buffer circuits 40 in buffer block 14 may be interconnected using an exemplary configuration summarized in the table of FIG. 10. To correct the duty cycle distortion of CLK0, a first buffer circuit 40 may be configured to receive CLK0 at its input terminal In, to receive CLK5 at its input terminal Iset (because CLK5 is offset by 225° phase with respect to CLK0), and to receive CLK3 at its input terminal Irelease (see, rows 220). To correct the duty cycle distortion of CLK1, a second buffer circuit 40 may be configured to receive CLK1 at its input terminal In, to receive CLK6 at its input terminal Iset (because CLK6 is offset by 225° phase with respect to CLK1), and to receive CLK4 at its input terminal Irelease (see, rows 222). To correct the duty cycle distortion of CLK2, a third buffer circuit 40 may be configured to receive CLK2 at its input terminal In, to receive CLK7 at its input terminal Iset (because CLK7 is offset by 225° phase with respect to CLK2), and to receive CLK5 at its input terminal Irelease (see, rows 224). To correct the duty cycle distortion of CLK3, a fourth buffer circuit 40 may be configured to receive CLK3 at its input terminal In, to receive CLK0 at its input terminal Iset (because CLK0 is offset by 225° phase with respect to CLK3), and to receive CLK6 at its input terminal Irelease (see, rows 226). To correct the duty cycle distortion of CLK4, a fifth buffer circuit 40 may be configured to receive CLK4 at its input terminal In, to receive CLK1 at its input terminal Iset (because CLK1 is offset by 225° phase with respect to CLK4), and to receive CLK7 at its input terminal Irelease (see, rows 228). To correct the duty cycle distortion of CLK5, a sixth buffer circuit 40 may be configured to receive CLK5 at its input terminal In, to receive CLK2 at its input terminal Iset (because CLK2 is offset by 225° phase with respect to CLK5), and to receive CLK0 at its input terminal Irelease (see, rows 230). To correct the duty cycle distortion of CLK6, a seventh buffer circuit 40 may be configured to receive CLK6 at its input terminal In, to receive CLK3 at its input terminal Iset (because CLK3 is offset by 225° phase with respect to CLK6), and to receive CLK1 at its input terminal Irelease (see, rows 232). To correct the duty cycle distortion of CLK7, an eight buffer circuit 40 may be configured to receive CLK7 at its input terminal In, to receive CLK4 at its input terminal Iset (because CLK4 is offset by 225° phase with respect to CLK7), and to receive CLK2 at its input terminal Irelease (see, rows 234).

Figure 11:
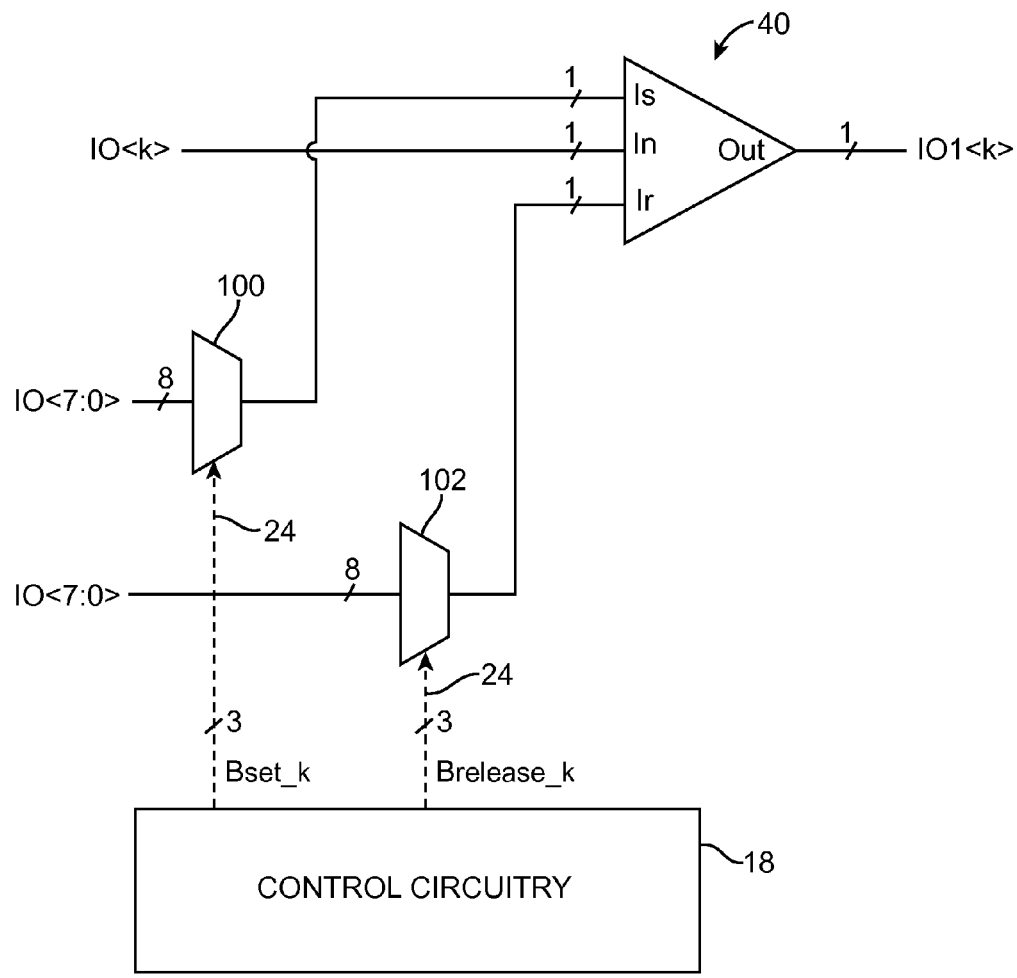
FIG. 11 is a diagram of an illustrative clock buffer circuit operable to be configured using control circuitry to provide desired duty cycle distortion correction in accordance with an embodiment of the present invention.

The configuration described in connection with FIG. 10 is merely illustrative. If desired, the eight buffer circuits 40 may be configured to provide 25% duty cycle correction, 37.5% duty cycle correction, 50% duty cycle correction, 62.5% duty cycle correction, 75% duty cycle correction, etc. As shown in FIG. 11, each buffer circuit 40 in the eight clock phase system may be configured to receive selected clock signals at its input for the desired duty cycle correction. In particular, a buffer circuit 40 that receives the $k^{th}$ clock signal at its main input In from terminal IO<k> may have its input terminal Iset coupled to multiplexer 100 and its input terminal Irelease coupled to multiplexer 102. Multiplexer 100 may receive all eight clock signals and may be configured to pass a selected one of the eight clock signals depending on the value of signal Bset_k received at its control input. Similarly, multiplexer 102 may receive all eight clock signals and may be configured to pass a selected one of the eight clock signals depending on the value of signal Brelease_k received at its control input. Control signals Bset_k and Brelease_k may be set using control circuitry 18 to provide the desired duty cycle correction.

Figure 12:
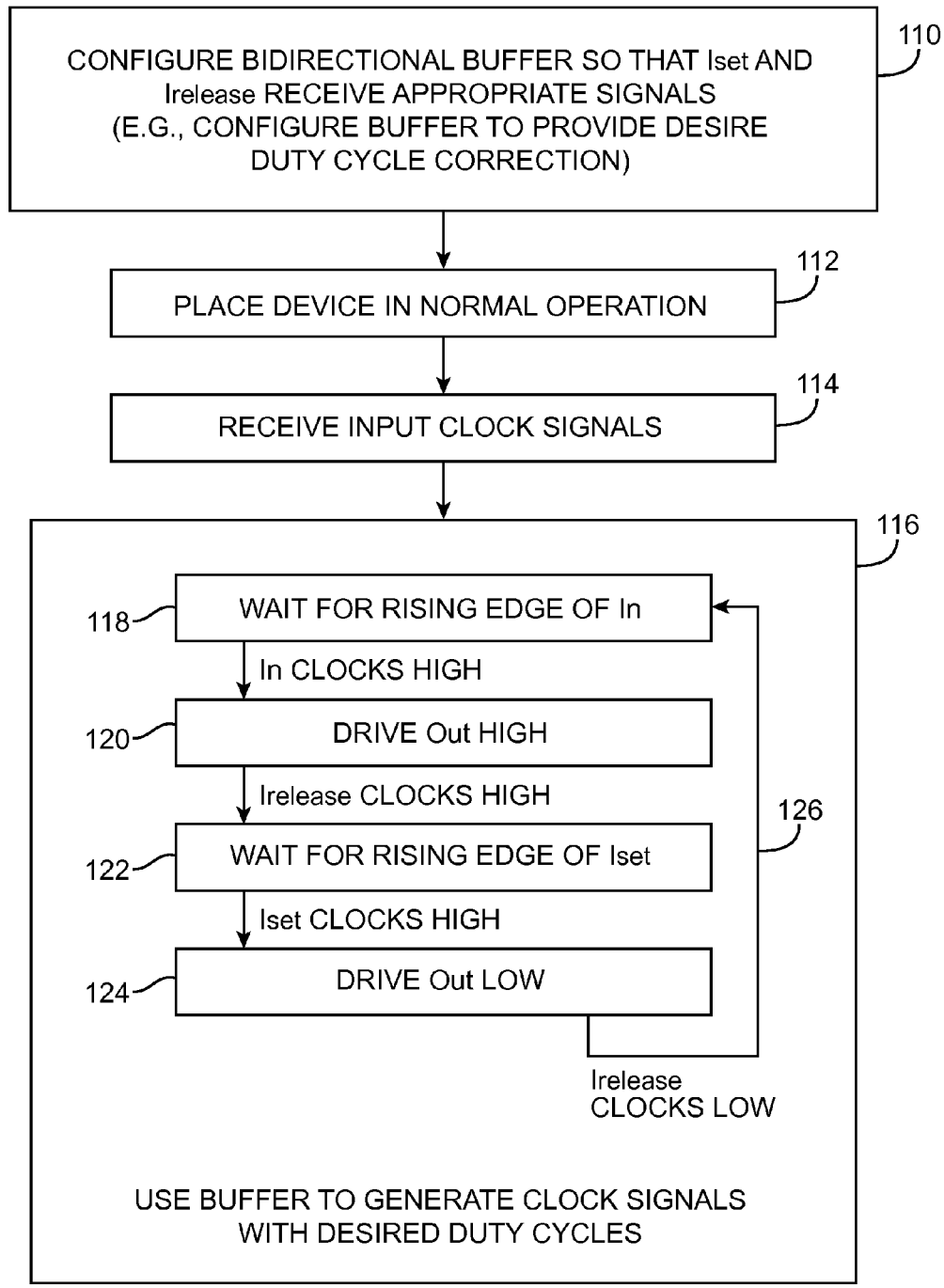
FIG. 12 is a flow chart of illustrative steps involved in using clock buffer circuitry of the type shown in connection with FIG. 11 to provide duty cycle distortion correction in accordance with an embodiment of the present invention.

FIG. 12 is a flow chart of illustrative steps involved in using clock buffer blocks 14 to provide duty cycle distortion correction. At step 110, clock buffer circuits 40 in each buffer block 14 may be configured so that input terminals Iset and Irelease receive appropriate signals (e.g., so that control circuitry 18 may configure multiplexers 100 and 102 to provide the desired duty cycle correction, as described in connection with FIG. 11). If desired, the control bits provided to multiplexers 100 and 102 may be stored in CRAM cells, fuses, antifuses, programmable read-only-memory memory cells, mask-programmed and laser-programmed structures, etc. At step 112, device 10 may be placed in normal operation. At step 114, buffer blocks 40 may receive input clock signals generated using phase-locked loop 12.

During normal operation of device 10, buffer blocks 14 may be used to drive clock signals to various regions on device 10 via clock distribution network 16 (step 116). The clock signals generated at the output of each clock buffer block 14 may exhibited corrected duty cycle.

At step 118, buffer circuit 40 may wait for a rising edge at input terminal In. In response to detecting a rising transition at terminal In, buffer circuit 40 may drive its output high (step 120). The clock signal at terminal Irelease may subsequently clock high. After the clock signal at terminal Irelease rises high, buffer circuit 40 may be configured to wait for a rising transition at Iset (step 122).

In response to detecting a rising transition at terminal Iset, buffer circuit 40 may drive its output low (step 124), thereby locking in the appropriate amount of high clock phase. The clock signal at terminal Irelease may subsequently clock low, and processing may loop back to step 118 to detect the next rising edge at input terminal In (as indicated by path 126). Buffer circuit 40 driving its output high at step 120 may serve to lock in the appropriate amount of low clock phase, thereby resulting in the desired amount of duty cycle distortion correction. The illustrative steps of 116 may be performed continuously in real time to ensure that buffer blocks 14 properly propagate clock signals down each clock buffer chain in clock distribution network 16 (see, e.g., FIG. 1).

The foregoing is merely illustrative of the principles of this invention and various modifications can be made by those skilled in the art without departing from the scope and spirit of the invention. The foregoing embodiments may be implemented individually or in any combination.

What is claimed is:

1. A buffer circuit comprising:
   a first input operable to receive a first clock signal;
   an output at which a corresponding output clock signal exhibiting a desired duty cycle is generated; and
   a second input operable to receive a second clock signal that is different than the first clock signal, wherein the second clock signal is delayed by an amount of phase offset with respect to the first clock signal, wherein the amount of phase offset is determined based on the desired duty cycle of the output clock signal.

2. The buffer circuit defined in claim 1 wherein the buffer circuit comprises a clock buffer circuit operable to receive the first and second clock signals from a phase-lock loop circuit.

3. The buffer circuit defined in claim 1 further comprising:
   a third input operable to receive a third clock signal that is different than the first and second clock signals, wherein the third clock signal is periodically asserted to allow a transition in the second clock signal to set the desired duty cycle of the output clock signal.

4. The buffer circuit defined in claim 3 wherein the first, second, and third clock signals comprise clock signals exhibiting equal clock frequencies.

5. The buffer circuit defined in claim 3 further comprising:
   a fourth input operable to receive a control signal, wherein the buffer circuit is placed in a tri-state mode when the control signal has a first value and wherein the buffer circuit is placed in an active mode when the control signal has a second value that is different from the first value.

6. The buffer circuit defined in claim 3 further comprising:
   a first logic gate having a first input operable to receive the second clock signal and a second input operable to receive the third clock signal, wherein the first logic gate is operable to pass through the transition in the second clock signal while the third clock signal is asserted and wherein the first logic gate is operable to output a signal at a fixed level while the third clock signal is deasserted.

7. The buffer circuit defined in claim 6 further comprising:
   a second logic gate having a first input coupled to the first input of the buffer circuit and a second input coupled to an output of the first logic gate.

8. The buffer circuit defined in claim 7 further comprising:
   an inverting circuit coupled between an output of the second logic gate and the output of the buffer circuit.

9. An integrated circuit comprising:
   clock generation circuitry operable to generated a plurality of clock signals; and
   buffer circuitry operable to receive the plurality of clock signals, wherein the buffer circuitry includes at least one buffer circuit that is operable to receive at least first and second clock signals in the plurality of clock signals and that is operable to generate a corresponding output clock signal with predetermined duty cycle based at least in part on the received first and second clock signals.

10. The integrated circuit defined in claim 9 wherein the clock generation circuitry comprises at least one phase-locked loop circuit.

11. The integrated circuit defined in claim 9 wherein the buffer circuitry includes an additional buffer circuit that is cross-coupled with the at least one buffer circuit to provide bidirectional buffering capability.

12. The integrated circuit defined in claim 9 wherein the at least one buffer circuit is further operable to receive a third clock signal in the plurality of clock signals, wherein the second and third clock signals are respective delayed versions of the first clock signal and wherein the third clock signal is periodically asserted to allow a transition in the second clock signal to set the desired duty cycle of the output clock signal.

13. The integrated circuit defined in claim 9 wherein the buffer circuitry includes additional buffer circuits coupled in parallel with the at least one buffer circuit.

14. The integrated circuit defined in claim 9 wherein the buffer circuitry includes additional buffer circuits coupled in series with the at least one buffer circuit.

15. A method of using a buffer circuit having an output and at least first and second inputs, the method comprising:
   receiving a first clock signal with the first input of the buffer circuit;
   receiving a second clock signal with the second input of the buffer circuit, wherein the second clock signal is a delayed version of the first clock signal; and
   generating an output clock signal that exhibits predetermined duty cycle at the output of the buffer circuit based at least partly on the received first and second clock signals.

16. The method defined in claim 15 further comprising:
   in response to detecting a rising edge in the first clock signal, driving the output clock signal high.

17. The method defined in claim 16 further comprising:
   in response to detecting a rising edge in the second clock signal, driving the output clock signal low.

18. The method defined in claim 15 further comprising:
   in response to detecting a rising edge in the second clock signal, driving the output clock signal low.

19. The method defined in claim 15 wherein the buffer circuit comprises a third input, the method further comprising:
   receiving a third clock signal with the third input of the buffer circuit, wherein the third clock signal is a delayed version of the first clock signal, wherein the third clock signal is different than the second clock signal, and wherein the third clock signal is configured to transition high during a first time period when the second clock signal is low and is configured to transition low during a second time period when the first clock signal is low.

20. The method defined in claim 19 wherein receiving the second clock signal with the second input of the buffer circuit comprises receiving the second clock signal through a first multiplexing circuit and wherein receiving the third clock signal with the third input of the buffer circuit comprises receiving the third clock signal through a second multiplexing circuit.

21. The method defined in claim 15 wherein the buffer circuit comprises a third input, the method further comprising:
- receiving a control signal with the third input of the buffer circuit;
- placing the buffer circuit in a tri-state mode when the control signal has a first value; and
- placing the buffer circuit in normal operation when the control signal has a second value that is different from the first value.

* * * * *

UNITED STATES PATENT AND TRADEMARK OFFICE
CERTIFICATE OF CORRECTION

PATENT NO. : 8,476,947 B2  
APPLICATION NO. : 13/295875  
DATED : July 2, 2013  
INVENTOR(S) : John Henry Bui et al.

Page 1 of 1

It is certified that error appears in the above-identified patent and that said Letters Patent is hereby corrected as shown below:

In the Drawings

Sheet 4, Fig. 4, the "logic NAND gates" 58 and 64 should be --logic AND gates--.

Signed and Sealed this
Twenty-seventh Day of March, 2018

Andrei Iancu
*Director of the United States Patent and Trademark Office*

UNITED STATES PATENT AND TRADEMARK OFFICE
CERTIFICATE OF CORRECTION

PATENT NO. : 8,476,947 B2  
APPLICATION NO. : 13/295875  
DATED : July 2, 2013  
INVENTOR(S) : John Henry Bui et al.

Page 1 of 1

It is certified that error appears in the above-identified patent and that said Letters Patent is hereby corrected as shown below:

In the Specification

In Column 6, Line 54, delete "gates 58 and 68" and insert -- gates 58 and 64 --

Signed and Sealed this  
First Day of January, 2019

Andrei Iancu  
*Director of the United States Patent and Trademark Office*